United States Patent [19]

Takahashi et al.

[11] Patent Number: 4,818,961
[45] Date of Patent: Apr. 4, 1989

[54] SURFACE ACOUSTIC WAVE FILTER WITH CAPACITIVE PHASE SHIFTER

[75] Inventors: Toshimitsu Takahashi, Yokohama; Takashi Shiba, Yokosuka; Yuji Fujita; Jun Yamada, both of Yokohama, all of Japan

[73] Assignee: Hitachi, Ltd., Tokyo, Japan

[21] Appl. No.: 181,700

[22] Filed: Apr. 14, 1988

[30] Foreign Application Priority Data

Apr. 15, 1987 [JP] Japan ............................. 62-90813

[51] Int. Cl.[4] ..................... H03H 9/64; H03H 9/145
[52] U.S. Cl. ............................. 333/194; 310/313 D; 333/195
[58] Field of Search .................... 333/150-155, 333/193-196; 310/313 R, 313 A, 313 B, 313 C, 313 D

[56] References Cited

U.S. PATENT DOCUMENTS 3,866,154  2/1975  Moore .............................. 333/154
4,689,586  8/1987  Yamada et al. .................... 333/194 X

FOREIGN PATENT DOCUMENTS 117907  6/1985  Japan .

OTHER PUBLICATIONS

Smith–"Experimental Distinction Between Crossed–Field and In-Line Three-Port Circuit Models for Interdigital Transducers", reprinted from IEEE Trans., MTT-22, 1974; pp. 960–964.
Yamanouchi et al.–"Low Insertion Loss Elastic Surface Wave Filter Using Group-Type Unidirectional Interdigital Transducer", Institute of Electronics and Communication Engineers of Japan (U.S. 75–15), 1975; pp. 25–30.

Primary Examiner—Marvin L. Nussbaum
Attorney, Agent, or Firm—Antonelli, Terry & Wands

[57] ABSTRACT

A group-type unidirectional surface acoustic wave filter composed of sending electrodes, reflecting electrodes and meander electrodes constituted by interdigital electrodes, respectively. As a phase shifter of the filter, a capacitive element is used. The geometrical configuration of the meander electrode is determined in accordance with geometrical phase difference. The filter enjoys low insertion loss with a simplified structure.

12 Claims, 12 Drawing Sheets

SURFACE ACOUSTIC WAVE FILTER WITH CAPACITIVE PHASE SHIFTER

BACKGROUND OF THE INVENTION

The present invention relates to a surface acoustic wave filter capable of exhibiting low insertion loss and ripple-reduced frequency characteristics notwithstanding of no use of inductor as a phase shifter and regardless of electrode array which can not necessarily assure perfect unidirectionality.

A unidirectional electrode array for the surface acoustic wave filter is reported, for example, in Yamanouchi et al's article entitled "Low Insertion Loss Elastic Surface Wave Filter Using Group-Type Unidirectional Interdigital Transducer" contained in Ultrasonic Wave Study Group Data "US75-15" published by The Institute of Electronics and Communication Engineers of Japan on 1975. In this known surface acoustic wave filter, an electrical phase difference of $\pi/2$ rad. is produced by a phase shifter, while the electrode array is so designed that the geometrical phase difference of $3\pi/2$ rad. can be established. With this structure of the filter, the surface acoustic wave can travel only in one direction, whereby improved filter characteristics are realized. The phrase "geometrical phase difference" means the phase difference which is determined by the inter-center distance between the electrodes. A meander electrode is disposed between the sending electrode and the reflecting electrode in a meandering pattern. When the sending electrode and the reflecting electrode are each implemented in a so-called split electrode configuration, there can be formed the geometrical phase difference of $3\pi/2$ rad. by such an electrode arrangement in which one finger of the meander electrode having a finger width of $\lambda_0/8$ (where $\lambda_0$ represents the wavelength of the surface acoustic wave at the center frequency of the filter) is disposed between the sending electrode and the reflecting electrode while three fingers of the meander electrode each having the width of $\lambda_0/8$ are disposed between other reflecting and sending electrodes. The split electrode is effective for suppressing the undesired waves produced due to discontinuity in the acoustic characteristic impedance at the boundary between a region formed with the finger and a region without finger.

Another type of the elastic surface wave filter is disclosed in JP-A-60-117907.

In either of the surface acoustic wave filters known heretofore, an inductive element is used as the phase shifter for producing the phase difference. For this reason, the prior art elastic surface wave filters are disadvantageous in manufacturing the filter in a miniature size on the mass production basis and besides suffers from a problem that noise is likely to be produced through electromagnetic induction.

SUMMARY OF THE INVENTION

An object of the present invention is to provide a surface acoustic wave filter in which only a capacitive element is used as the phase shifter.

In conjunction with the object contemplated by the invention, it should be mentioned that a great difficulty will be encountered in realizing the phase shifter capable of producing a desired electrical phase difference simply by resorting to the use of the capacitive element because of the internal resistance and unevenness in the capacity. In reality, when the phase shifter is constituted by the capacitive element, the electrical phase difference produced by the phase shifter is deviated from the desired value. This problem will be discussed below in detail on the assumption that the desired electrical phase difference is $\pi/2$ rad. There exists the following relation between the geometrical phase difference and the electrical phase difference:

$$\phi_M - \phi_E = (2n-1)\pi \text{(rad.)}$$

where n represents a natural number, $\phi_M$ represents the geometrical phase difference and $\phi_E$ represents the electrical phase difference. Consequently, when the electrical phase difference is deviated from $\pi/2$ rad., the geometrical phase difference is also deviated from $3\pi/2$ rad., which in turn means that the conditions for suppressing the undesired waves are no more satisfied. This is because each of the electrode fingers and the gap therebetween are so designed as to validate the conditions for suppressing the undesired waves produced due to the discontinuity in the acoustic characteristic impedance. Concerning the problem of the undesired wave generation due to the discontinuity in the acoustic characteristic impedance, reference may be made to a literature entitled "Experimental Distinction Between Crossed-Field and In-Line Three-Port Circuit Models for Interdigital Transducers" contained in IEEE Trans., 1974, MTT-22, PP. 960-964.

With a view to coping with the above-mentioned problems in the surface acoustic wave filter in which the phase shifter for producing the electrical phase difference is constituted only by the capacitive element, the present invention also proposes a specific arrangement of the electrode fingers. More specifically, each of the sending electrode, the reflecting electrode and the meander electrode is realized in the split type electrode configuration, wherein the width of each electrode finger is selected to be $\lambda_0/8$ (where $\lambda_0$ represents the wavelength of surface acoustic wave at the center frequency of the filter), while the distance from the fingers of the sending electrode and the reflecting electrode to the opposite meander electrode is selected to be $\lambda_0/8$. Besides, the finger width and the inter-finger gap of the meander electrodes disposed between the sending electrode and the reflecting electrode within a same group or between the reflecting electrode of a given electrode group and the sending electrode of a succeeding electrode group are determined in dependence on magnitude of the geometrical phase difference $\phi_M$.

More specifically, (a) in case $5/4\pi < \phi_M < 7/4\pi$ (rad.) the finger width $\alpha_1$ of the meander electrode located between the sending electrode and the reflecting electrode within a same group has one electrode finger having a width $\alpha_1$ while the meander electrode located between the reflecting electrode of one electrode group and the sending electrode of a succeeding electrode group has three electrode fingers in which the center electrode finger having a width $\beta_1$;

the widths $\alpha_1$ and $\beta_1$ being, respectively, given by $$\alpha_1 = \left(\frac{\phi_M}{2\pi} - \frac{5}{8}\right)\lambda_0, \text{ and}$$

$$\beta_1 = \frac{\lambda_0}{4} - \alpha_1$$

(b) in case $7/4\pi \leqq \phi_M \leqq 9/4\pi$ (rad.) the meander electrode located between the sending electrode and the reflecting electrode within a same group has two electrode fingers spaced by $\alpha_2$ while the meander electrode located between the reflecting electrode of a given electrode group and the sending electrode of a succeeding electrode group has two electrode fingers spaced by $\beta_2$;

the spaces $\alpha_2$ and $\beta_2$ being, respectively, given by $$\alpha_2 = \left(\frac{\phi_M}{2\pi} - \frac{7}{8}\right)\lambda_0, \text{ and}$$

$$\beta_2 = \frac{\lambda_0}{4} - \alpha_2 \text{ or}$$

(c) in case $9/4\pi < \phi_M < 11/4\pi$ (rad.)

the meander electrode located between the sending electrode and the reflecting electrode within a same group has three electrode fingers in which the center electrode finger has a width $\alpha_3$ while the meander electrode located between the reflecting electrode of a given electrode group and the sending electrode of a succeeding electrode group has one electrode finger having a width $\beta_3$, the widths $\alpha_3$ and $\beta_3$ being, respectively, given by $$\alpha_3 = \left(\frac{\phi_M}{2\pi} - \frac{9}{8}\right)\lambda_0, \text{ and}$$

$$\beta_3 = \frac{\lambda_0}{4} - \alpha_3$$

With the arrangement described above, the undesired waves produced due to the discontinuity in the acoustic characteristic impedance can be mutually cancelled out within one group of the sending electrode, the meander electrode and the reflecting electrode to be thus suppressed, even when the electrical phase difference between the applied voltages and the geometrical phase difference between the deposited electrodes should be deviated from an odd multiple of 90°. Thus, there can be provided the surface acoustic wave filter of low loss and low ripple.

DESCRIPTION OF THE PREFERRED EMBODIMENTS

Now, the present invention will be described in detail in conjunction with the illustrated embodiments thereof.

Figure 1:
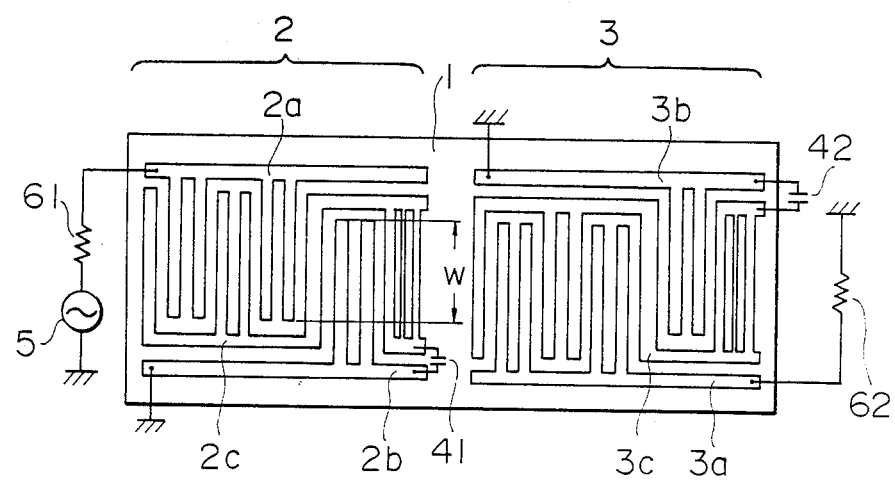
FIG. 1 is a schematic top plan view of a surface acoustic wave filter according to an exemplary embodiment of the present invention.
Figure 2:
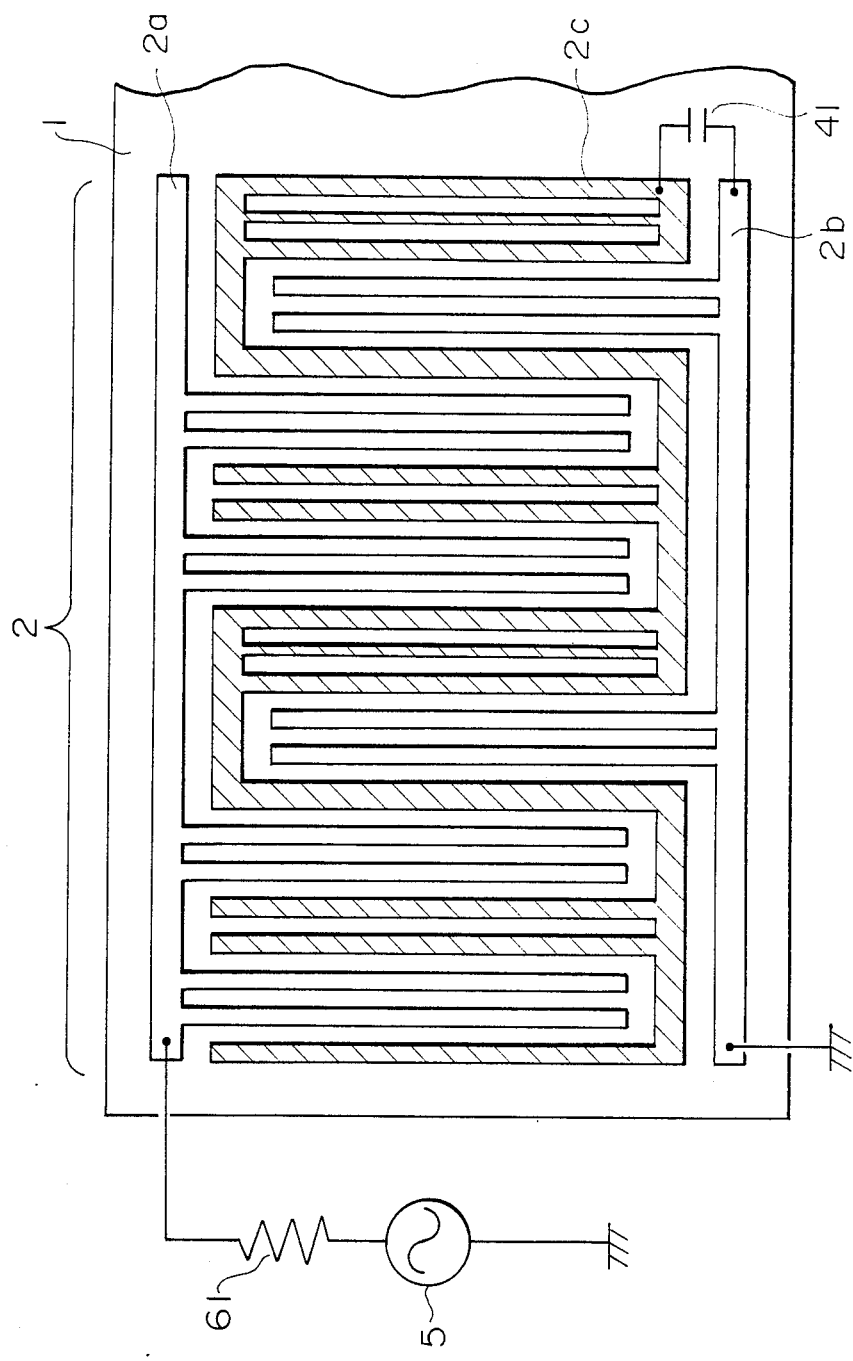
FIG. 2 is an enlarged fragmental view of the filter shown in FIG. 1 in which two groups of sending electrodes are provided.
Figure 3:
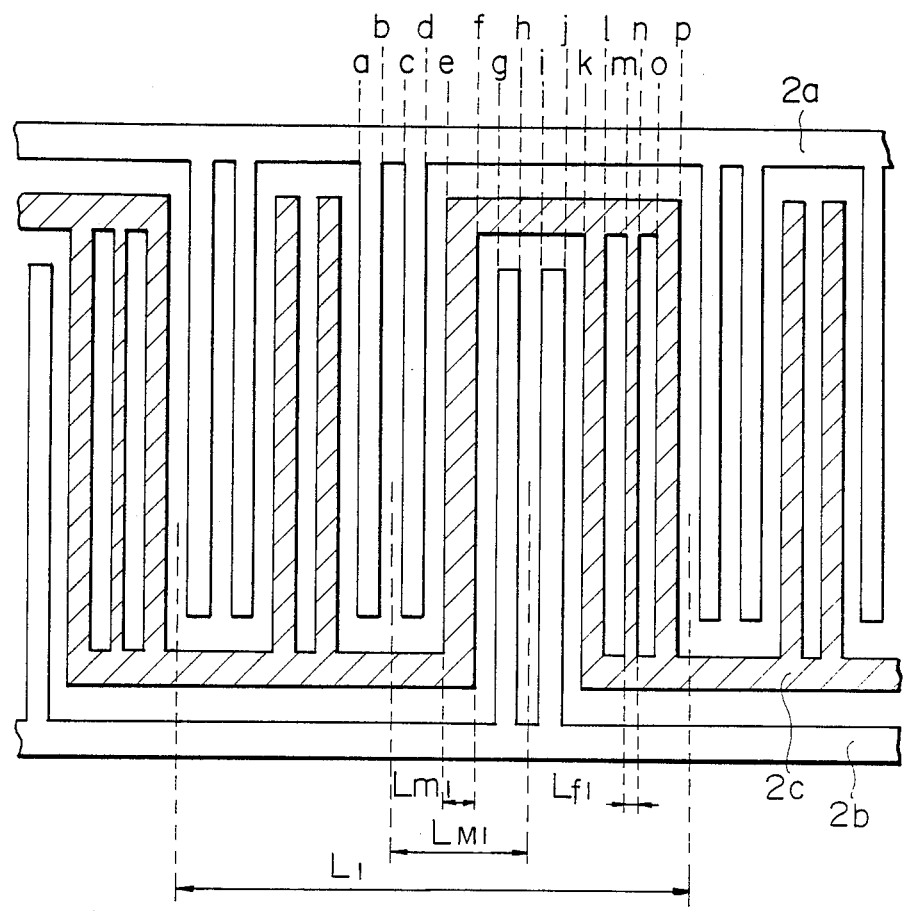
FIG. 3 is a further enlarged fragmental view of the filter shown in FIG. 2.

FIG. 1 shows in a schematic top plan view a surface acoustic wave filter according to an embodiment of the invention. In the case of this filter, the geometrical phase difference $\phi_M$ is selected to be 310° ($5\pi/4 < \phi_M < 7\pi/4$). An input electrode array generally denoted by a reference numeral 2 is composed of a sending electrode 2a, a reflecting electrode 2b and a meander electrode 2c. An output electrode array 3 is composed of a sending electrode 3a, a reflecting electrode 3b and a meander electrode 3c. These input and output electrodes 2 and 3 are deposited on a piezoelectric substrate 1 which is formed of 128°-rotation Y-cut X-propagation lithium niobate mono-crystal. The aperture length W of the input and output electrodes 2 and 3 which is defined as the length along which the electrode fingers extend in opposition is constant. In the case of the embodiment shown in FIG. 1, the input electrodes 2 and the output electrodes 3 are each provided in one groups. For one group of the input electrodes 2, two pairs of surface acoustic wave excitation sources are provided in the sending electrodes 2a with one pair of the electric surface excitation sources for the reflecting electrodes 2b. Similarly, in one group of the output electrodes 3, two pairs of the surface acoustic wave excitation sources are provided for the sending electrodes 3a with one pair of excitation sources for the reflecting electrodes 3b. The center frequency is 56.5 MHz. The finger width of the sending electrode and the reflecting electrode is 8.6 μm, both electrodes being constituted by split electrodes. The sending electrodes 2a and 3a are connected to load impedances 61 and 62, respectively, each of which is 1.8 kΩ. In the surface acoustic wave filter according to the instant embodiment of the invention, the number of paired fingers of the sending electrode differs from that of the reflecting electrode. The sending electrode and the reflecting electrode are connected in series. With this arrangement, the phase shifter constituted by inductance element is omitted and capacitive phase shifters 41 and 42 are used. These phase shifters 41 and 42 are formed on the substrate 1 simultaneously with the electrodes. Thus, implementation of the capacitive phase shifters is facilitated. The capacitive phase shifter 41 is connected between the reflecting electrode 2a and the meander electrode 2c while the capacitive phase shifter 42 is connected between the reflecting electrode 3b and the meander electrode 3c. The reflecting electrodes 2b and 3b are both grounded. The sending electrode 2a is connected to a signal source 5 through the load impedance 61. Upon inputting of signal from the signal source, surface acoustic wave is excited by the input electrode array 2. The excited elastic surface wave is converted into an electric signal by the output electrode array 3 to be outputted to the load impedance 62. In the surface acoustic wave filter shown in FIG. 1, the input and output electrodes are provided each in one group. It should however be appreciated that the input and output electrodes may be provided each in a plurality of groups. FIG. 2 shows a practical surface acoustic wave filter according to another embodiment of the invention in which the individual electrodes 2a, 2b and 2c are provided each in two groups. In the structure shown in FIG. 2, the length and width of the electrode finger and the inter-finger gap are the same as those in the filter structure shown in FIG. 1. In other words, the device shown in FIG. 2 differs from the one shown in FIG. 1 only in the number of the groups of the individual electrodes. More specifically, FIG. 2 shows in an enlarged view an input electrode array in which the individual electrodes 2a, 2b and 2c are provided each in two groups, the output electrode array being omitted from illustration. For the sake of clarification, the meander electrode is indicated by hatching. The number of electrode groups in the input and output electrode arrays 2 and 3 can be determined freely in dependence on the characteristics of the circuit to be connected to the surface acoustic wave filter. Further, the number of electrode groups in the input electrode array may differ from that of the output electrode array. By way of example, eight groups of electrodes may be installed for each of the input electrode array 2 and the output electrode array 3, and it is equally possible to provide eight groups of electrode for the input electrode array 2 with seven groups of electrodes being employed in the output electrode array 3. FIG. 3 shows in an enlarged fragmental view an input electrode array in a surface acoustic wave filter according to another embodiment of the invention in which a plurality of electrode groups are disposed. The pattern in which the individual electrodes are disposed is the same as that of the input electrode array shown in FIG. 2. Further, the meander electrodes are indicated by hatching also in FIG. 3. Assuming now that one electrode group corresponds to the range indicated by $L_1$ in FIG. 3, the geometrical phase difference $\phi_M$ corresponds to a length $L_{M1}$ shown in the same figure. When the center frequency $f_0$ is 56.5 MHz with the propagation speed v of the surface acoustic wave being 3880 m/s, the wavelength $\lambda_0$ is determined as follows:

$$\lambda_0 = \frac{v}{f_0} \approx 6.87 \times 10^{-5} \text{ (m)} + 68.7 \text{ (μm)}$$

From the value of $\lambda_0$, $\alpha_1$ and $\beta_1$ can be determined as follows:

$$\alpha_1 = \left(\frac{\phi_M}{2\pi} - \frac{5}{8}\right)\lambda_0$$

$$= \left(\frac{310}{360} - \frac{5}{8}\right) \times 68.7 \approx 16.2 \times 10^{-6} \text{ (m)}$$

$$\beta_1 = \frac{\lambda_0}{4} - \alpha = 0.95 \times 10^{-6} \text{ (m)}$$

On the basis of the values of $\alpha_1$ and $\beta_1$, the width $L_{m1}$ of the meander electrode finger between the sending electrode and the reflecting electrode is 16 μm, while the center one of the triplet meander electrode fingers located between the reflecting electrode of the same group and the sending electrode of the succeeding group has a width $L_{f1}$ of 1 μm.

Figure 4A:
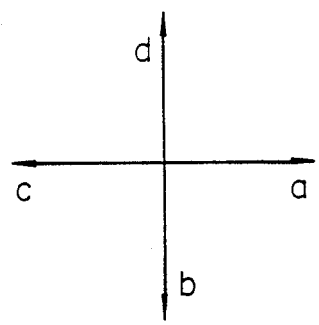
FIGS. 4A to 4D are schematic diagrams for illustrating phase statuses of undesired waves produced in the filter shown in FIG. 3.
Figure 4B:
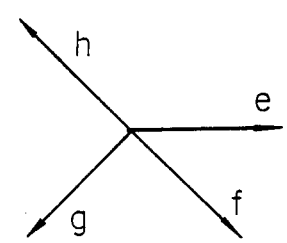
Figure 4C:
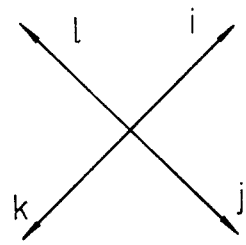
Figure 4D:
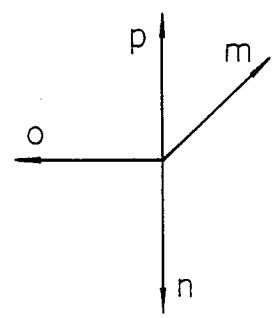

FIGS. 4A to 4D are views for illustrating in what manner the undesired waves are suppressed. Phase relations among the undesired waves reflected at points a, b, ..., p shown in FIG. 3 are represented by directions of vectors in FIGS. 4A to 4D. More specifically, the undesired wave reflected at the point a shown in FIG. 3 is represented by vector a in FIG. 4A. The undesired wave reflected at the point b in FIG. 3 is represented by a vector b in FIG. 4A. The undesired wave reflected at the point b (vector b) is deviated in the phase by 90° from the undesired wave reflected at the point a (vector a). Similarly, the phases of the undesired waves reflected at points c to p are illustrated, respectively, with reference to the phase represented by the vector a. As will be seen in FIG. 4, the undesired wave (vector a) reflected at the point a is out of phase by 180° with the undesired wave (vector c) reflected at the point c. Accordingly, these waves cancel out each other. Similarly, the undesired wave reflected at the point b (vector b) and the undesired wave reflected at the point c (vector c) cancel out each other. The cancelling of the vectors a, b, c and d to be zeroed is ascribable to the provision of the split type electrodes. Further, the undesired wave reflected at a point f in FIG. 3 (represented by vector f in FIG. 4B) and the undesired wave reflected at a point h in FIG. 3 (represented by vector h in FIG. 4B) cancel out each other. Similarly, vector i or h cancel out each other with vectors i and l cancelling out each other, as is illustrated in FIG. 4C. Additionally, vectors p and n cancel out each other, as will be seen in FIG. 4D. Besides, vector e (FIG. 4B) and vectors o (FIG. 4D) cancel out each other with vector g (FIG. 4B) and vector m (FIG. 4D) cancelling out each other. In this way, the undesired waves are mutually cancelled out and thus suppressed within one electrode group. Parenthetically, the undesired waves generated at other individual electrode fingers are suppressed according to the same principle as described above in conjunction with FIG. 4A within each group because of the split configuration of the electrodes. As will be appreciated from the foregoing elucidation, in the surface acoustic wave filters shown in FIGS. 1, 2 and 3, the undesired waves are suppressed, whereby the surface acoustic wave of improved characteristics can be obtained.

In the case of the electrode array, shown in FIGS. 1 and 2, one group of the sending, reflecting and meander electrodes is connected to another group of these electrodes on the group-by-group basis. However, the electrode array may be so implemented as to start with an intermediate electrode in one group and end at an intermediate electrode in another group. By way of example, such electrode array can be adopted in which the array starts with the electrode part indicated by the point a followed by cascaded connection of several cascaded electrode groups (or one electrode group) and ending at the electrode part corresponding to the point a in the last electrode group. With these arrangements of the electrode array, the undesired waves are mutually cancelled out according to the principle similar to that described in conjunction with FIGS. 3 and 4, whereby the advantageous effect mentioned above can be obtained.

Figure 5:
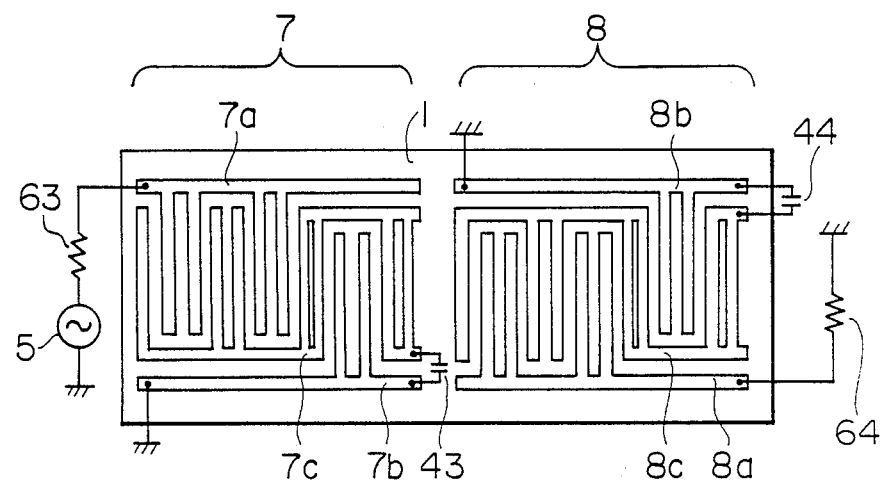
FIG. 5 is a schematic top plan view of a surface acoustic wave filter according to another embodiment of the invention.

FIG. 5 shows in a schematic top plan view a surface acoustic wave filter according to another embodiment of the present invention. In the case of this filter, the geometrical phase difference $\phi_M$ is selected to be 330° ($7\pi/4 < \phi_M < 9\pi/4$). An input electrode array 7 is composed of a sending electrode 7a, a reflecting electrode 7b and a meander electrode 7c. An output electrode array 8 is composed of a sending electrode 8a, a reflecting electrode 8b and a meander electrode 8c. These input and output electrodes 7 and 8 are deposited on a piezoelectric substrate 1 which may be formed of 128°-rotation Y-cut X-propagation lithium niobate monocrystal, as in the case of the embodiment shown in FIG. 1. The aperture length W as well as implementation of the individual electrodes in the form of split electrodes in the filter shown in FIG. 5 is identical with the case of the embodiment shown in FIG. 1. Difference of the filter shown in FIG. 5 from the one shown in FIG. 1 is seen in the positional relation between the sending electrode and the reflecting electrode due to different geometrical phase difference, being accompanied with a corresponding partial difference in the structure of the meander electrode. In this embodiment, the center frequency is also 56.5 MHz. The load impedances 63 and 64 are of 1.8 kΩ.

Figure 6:
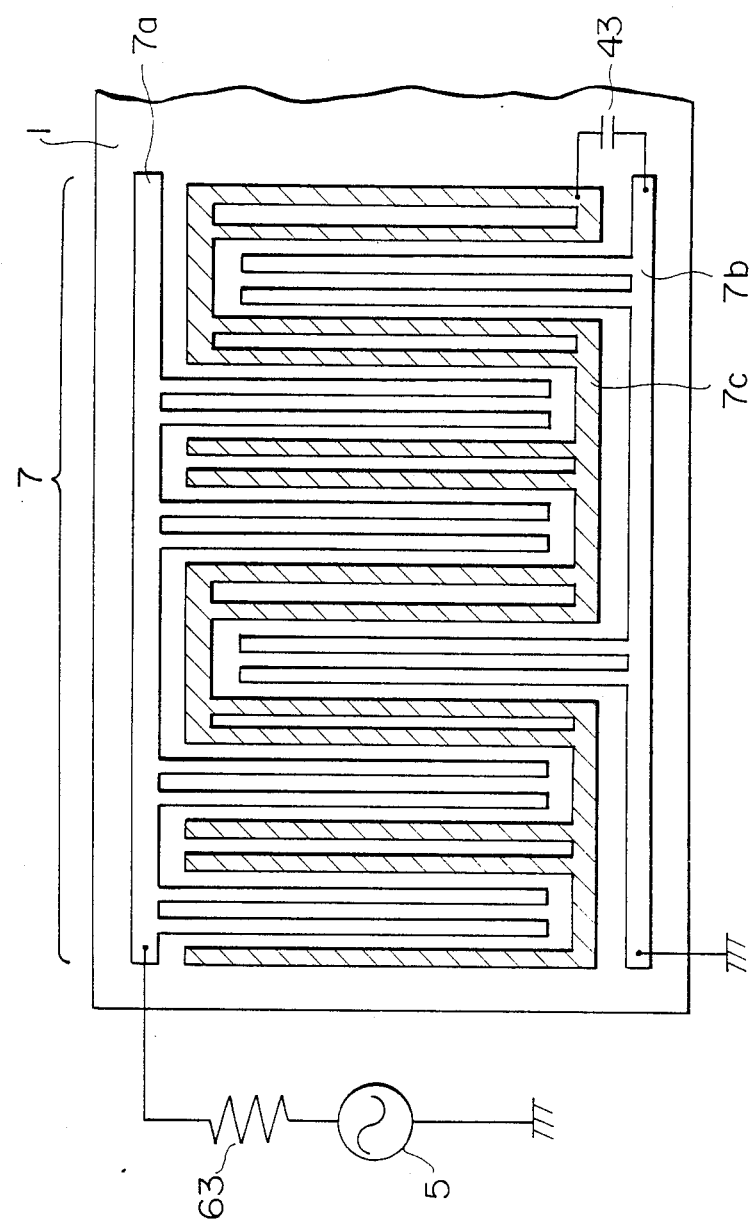
FIG. 6 is an enlarged fragmental view of the filter shown in FIG. 5 in which two groups of sending electrodes are provided.
Figure 7:
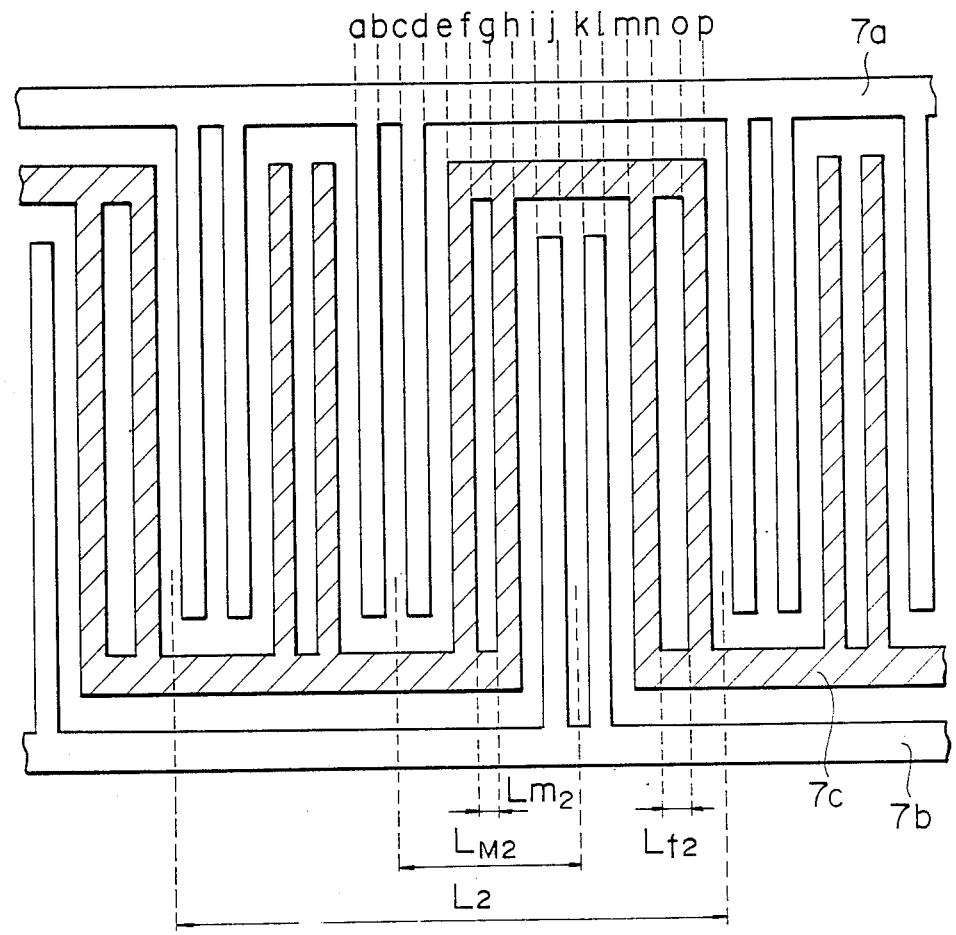
FIG. 7 is a further enlarged fragmental view of the filter shown in FIG. 6.
Figure 8A:
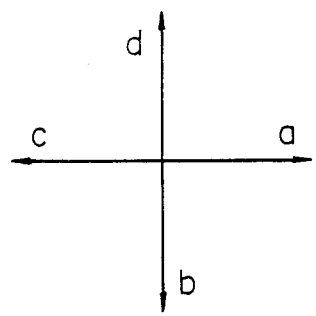
FIGS. 8A to 8D are schematic diagrams for illustrating phase statuses of undesired waves produced in the filter shown in FIG. 7.
Figure 8B:
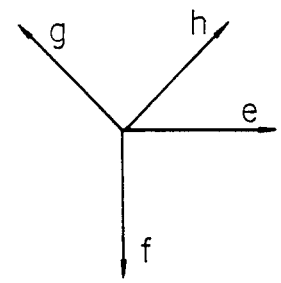
Figure 8C:
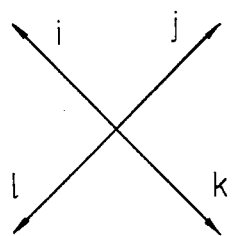
Figure 8D:
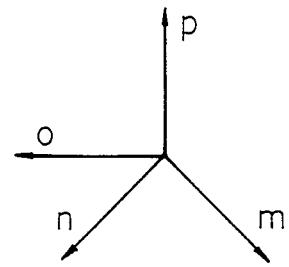

In the surface acoustic wave filter shown in FIG. 5, the input and output electrodes 7 and 8 are provided each in one group. It should however be appreciated that the input and output electrodes may be provided each in a plurality of cascaded groups. FIG. 6 shows a practical surface acoustic wave filter according to another embodiment of the invention in which the individual electrodes are provided each in two groups. In the structure shown in FIG. 6, the length and width of the electrode finger and the inter-finger gap are the same as those in the filter structure shown in FIG. 5. In other words, the device shown in FIG. 6 differs from the one shown in FIG. 5 only in the number of the groups of the individual electrodes. More specifically, FIG. 6 shows in an enlarged view an input electrode array 7 in which the individual electrodes are provided each in two groups, the output electrode array being omitted from illustration. For the sake of clarification, the meander electrode is indicated by hatching. The number of electrode groups in the input and output electrode arrays 7 and 8 can be determined freely in dependence on the characteristics of the circuit to be connected to this surface acoustic wave filter, as in the case of the embodiment shown in FIG. 2. Further, the number of electrode groups in the input electrode array 7 may differ from that of the output electrode array 8. By way of example, eight groups of electrodes may be installed for each of the input electrode array 7 and the output electrode array 8, and it is equally possible to provide eight groups of electrode for the input electrode array 7 with seven groups of electrodes being employed in the output electrode array 8. FIG. 7 shows in an enlarged fragmental view an input electrode array in a surface acoustic wave filter according to another embodiment of the invention in which a plurality of electrode groups are disposed. The pattern in which the individual electrodes are disposed is the same as that of the input electrode arrays shown in FIGS. 5 and 6. Further, the meander electrodes are indicated by hatching also in FIG. 7. Assuming now that one electrode group corresponds to the range indicated by L₂ in FIG. 7, the geometrical phase difference $\phi_M$ corresponds to a distance $L_{M2}$ shown in the same figure. The wavelength $\lambda_0$ is 68.7 μm, as in the case of the filter shown in FIG. 1. From the value of $\lambda_0$, $\alpha_2$ and $\beta_2$ can be determined as follows:

$$\alpha_2 = \left(\frac{\phi_M}{2\pi} - \frac{7}{8}\right)\lambda_0 \approx 2.9 \times 10^{-6} \text{ (m)}$$

$$\beta_2 = \frac{\lambda_0}{4} - \alpha_2 \approx 14.3 \times 10^{-6} \text{ (m)}$$

On the basis of the values of $\alpha_2$ and $\beta_2$, the distance $L_{m2}$ between the two meander electrode fingers located between the sending electrode and the reflecting electrode is 2.9 μm, while the distance $L_{f1}$ between the two meander electrode fingers located between the reflecting electrode of the same group and the sending electrode of the succeeding group is 14 μm.

FIGS. 8A to 8D are views for illustrating in what manner the undesired waves are suppressed in the filters shown in FIGS. 5 to 7. Phase relations among undesired waves reflected at points a, b, ..., p shown in FIG. 7 are represented by directions of vectors in FIGS. 8A to 8D. More specifically, the undesired wave reflected at the point a shown in FIG. 7 is represented by vector a in FIG. 8A. The undesired wave reflected at the point b in FIG. 7 is represented by a vector b in FIG. 8A. The phases of the undesired waves reflected at points a to p are illustrated, respectively, with reference to the phase represented by the vector a. As will be seen in FIG. 8, the undesired wave (vector a) reflected at the point a is out of phase by 180° with the undesired wave (vector c) reflected at the point c. Accordingly, these waves cancel out each other to be zeroed. Similarly, the undesired wave reflected at the point b (vector b) and the undesired wave reflected at the point c (vector c) cancel out each other to be zeroed. The mutual cancelling of the vectors a, b, c and d is ascribable to the provision of the split electrodes, as in the case of the filter shown in FIG. 4. Further, the undesired wave reflected at a point e in FIG. 8 (represented by vector e in FIG. 8D) and the undesired wave reflected at a point o (represented by vector o in FIG. 8D) cancel out each other. Similarly, vectors f and p cancel out each other with vectors g and m cancelling out each other. Additionally, vectors h and n cancel out each other. Besides, vector i and vector h cancel out each other with vector j and vector l cancelling out each other. In this way, the undesired waves are mutually cancelled out and thus suppressed within one electrode group. Parenthetically, the undesired waves generated at other individual electrode fingers are suppressed according to the same principle as described above in conjunction with FIG. 8A within the respective group because of the split configuration of the electrodes. As will be appreciated from the foregoing elucidation, according to the structures of the surface acoustic wave filters shown in FIGS. 5, 6, and 7, the undesired waves are suppressed, whereby the surface acoustic wave of improved characteristics can be obtained.

In the case of the electrode array, shown in FIGS. 5 and 6, one group of the sending, reflecting and meander electrodes is connected to another group of these electrodes on the group-by-group basis. However, the electrode array may be so implemented as to start with an intermediate electrode in one group and end in an intermediate electrode in another group. By way of example, such electrode array can be adopted in which the array starting with the electrode part indicated by the point a shown in FIG. 7 is followed by cascaded connection of several cascaded electrode groups (or one electrode group), ending at the electrode part corresponding to the point a in the last electrode group. With these arrangements of the electrode array, the undesired waves are mutually cancelled out according to the principle similar to that described in conjunction with FIGS. 5 and 6, whereby the advantageous effect mentioned above can be obtained, as in the case of the filter structures shown in FIGS. 1 to 3.

Figure 9:
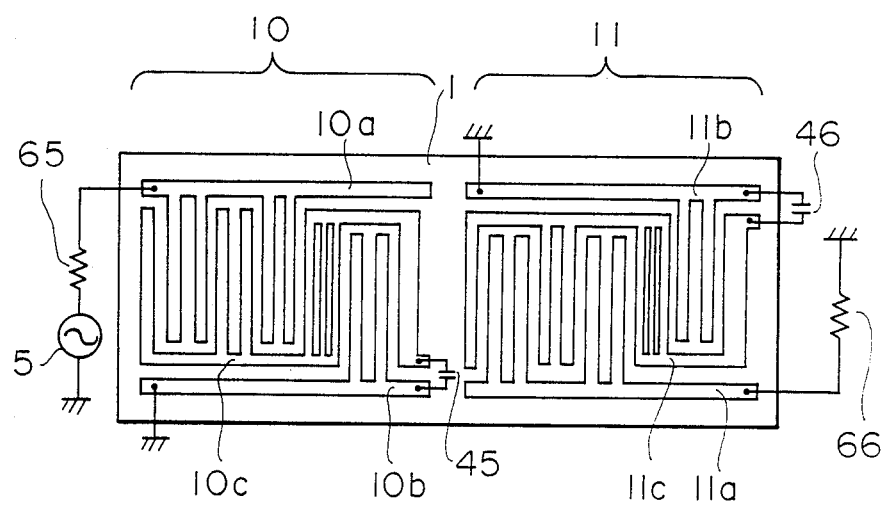
FIG. 9 is a schematic top plan view showing a surface acoustic wave filter according to still another embodiment of the invention.

FIG. 9 shows a surface acoustic wave filter according to a further embodiment of the present invention. In the case of this filter, the geometrical phase difference $\phi_M$ is selected to be 410° ($9\pi/4 < \phi_M < 11\pi/4$). An input electrode array 10 is composed of a sending electrode 10a, a reflecting electrode 10b and a meander electrode 10C.

An output electrode array 11 is composed of a sending electrode 11a, a reflecting electrode 11b and a meander electrode 11c. These input and output electrodes 10 and 11 are deposited on a piezoelectric substrate 1 which may be formed of 128°-rotation Y-cut X-propagation lithium niobate mono-crystal, as is in the case of the embodiment shown in FIG. 1. The aperture length W and implementation of the individual electrodes in the form of split electrodes in the filter shown in FIG. 9 is identical with the case of the embodiment shown in FIG. 1. Difference of the filter shown in FIG. 9 from the one shown in FIG. 1 is seen in the positional relation between the sending electrode and the reflecting electrode due to the different geometrical phase difference, being accompanied with a corresponding partial difference in the structure of the meander electrode. In the case of this embodiment, the center frequency is also 56.5 MHz. The load impedances 65 and 66 are of 1.8 kΩ.

Figure 10:
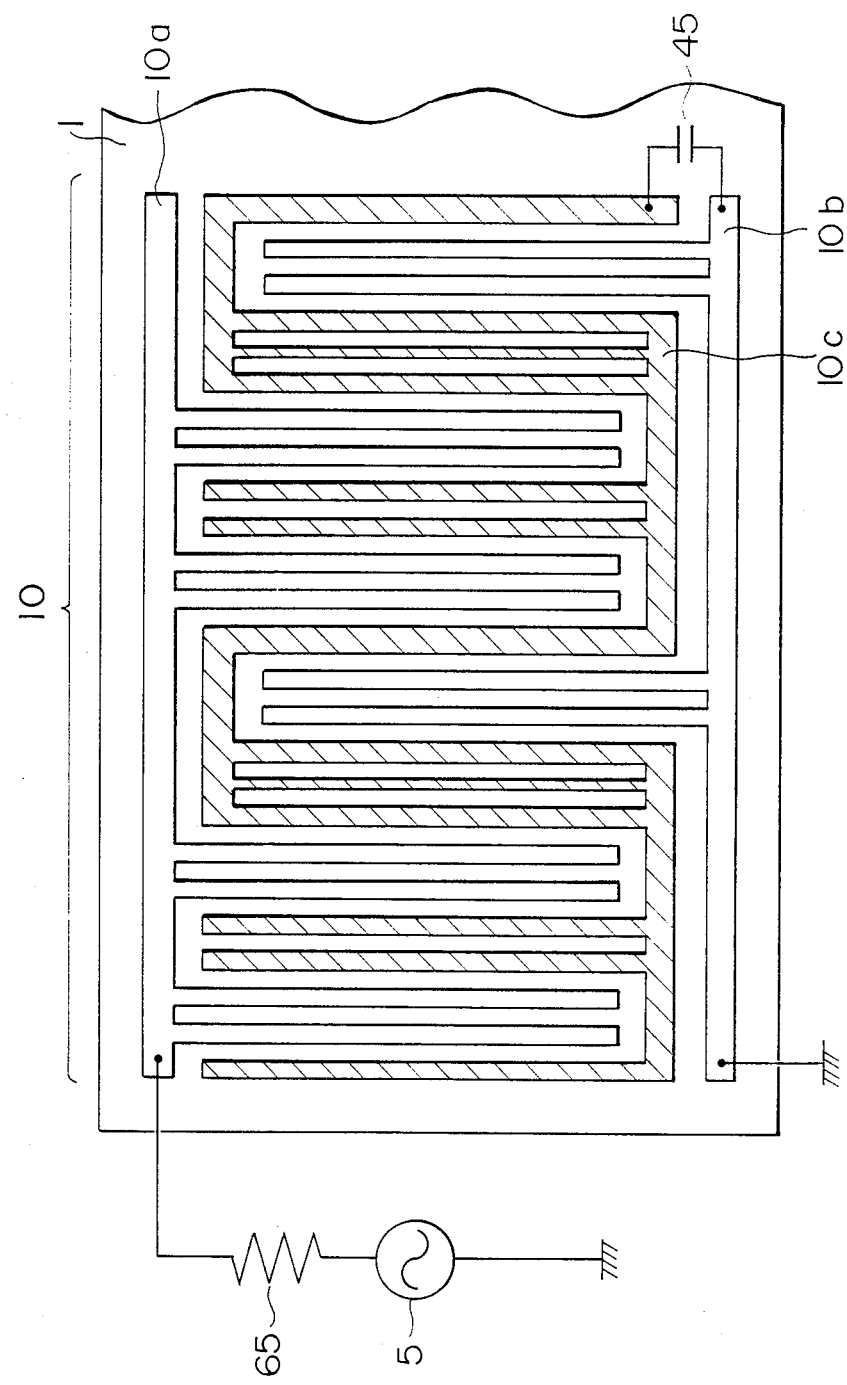
FIG. 10 is an enlarged fragmental view of the filter shown in FIG. 9 in which two groups of sending electrodes are provided.
Figure 11:
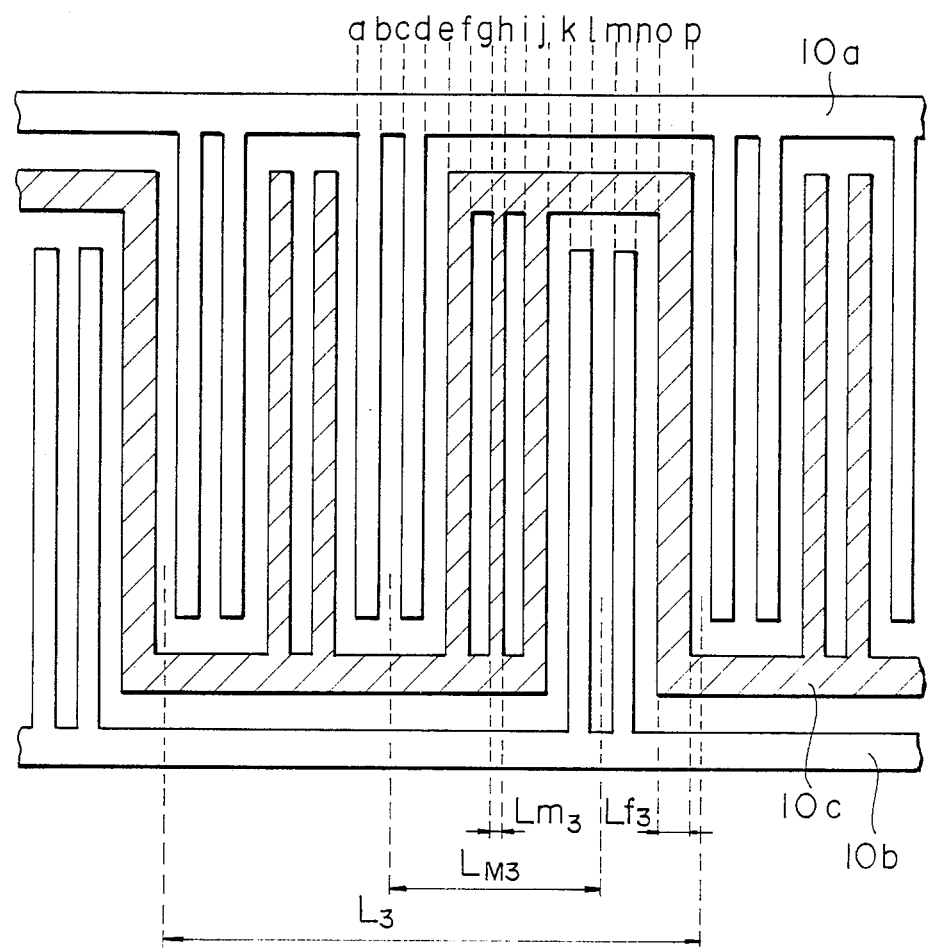
FIG. 11 is a further enlarged fragmental view of the filter shown in FIG. 10.
Figure 12A:
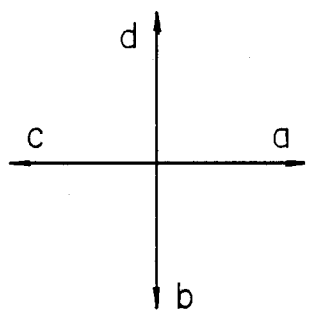
FIGS. 12A to 12D are schematic diagrams for illustrating phase statuses of undesired waves produced in the filter shown in FIG. 11.
Figure 12B:
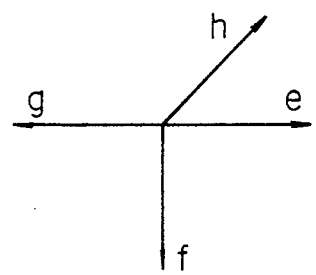
Figure 12C:
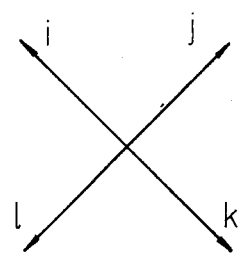
Figure 12D:
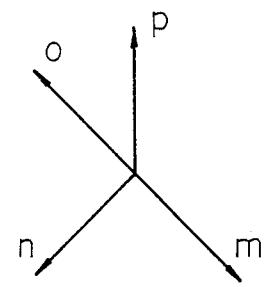

In the surface acoustic wave filter shown in FIG. 9, the input and output electrodes 10 and 11 are provided each in one group, as in the case of the embodiment shown in FIG. 1. It should however be appreciated that the input and output electrodes may be provided each in a plurality of cascaded groups. FIG. 10 shows a practical surface acoustic wave filter according to still another embodiment of the invention in which the individual electrodes are provided each in two groups. In the structure shown in FIG. 10, the length and width of the electrode finger and the inter-finger gap are, respectively, same as those in the filter structure shown in FIG. 9. In other words, the device shown in FIG. 10 differs from the one shown in FIG. 9 only in the number of the groups of the individual electrodes. More specifically, FIG. 10 shows in an enlarged view an input electrode array 10 in which the individual electrodes are provided each in two groups, the output electrode array 11 being omitted from illustration. For the sake of clarification, the meander electrode is indicated by hatching. The number of electrode groups in the input and output electrode arrays 10 and 11 can be determined freely in dependence on the characteristics of the circuit to be connected to this surface acoustic wave filter, as in the case of the embodiment shown in FIG. 2. Further, the number of electrode groups in the input electrode array 10 may differ from that of the output electrode array 11. By way of example, eight groups of electrodes may be installed for each of the input electrode array 10 and the output electrode array 11, and it is equally possible to provide eight groups of electrodes for the input electrode array 10 with seven groups of electrodes being employed in the output electrode array 11. FIG. 11 shows in an enlarged fragmental view an input electrode array in a surface acoustic wave filter according to yet another embodiment of the present invention in which a plurality of electrode groups are disposed. The pattern in which the individual electrodes are disposed is same as that of the input electrode arrays shown in FIGS. 9 and 10. Further, the meander electrodes are indicated by hatching also in FIG. 11. Assuming now that one electrode group corresponds to the range indicated by $L_3$ in FIG. 11, the geometrical phase difference $\phi_M$ corresponds to a distance $L_{M3}$ shown in the same figure. The wavelength $\lambda_0$ is 68.7 μm, as in the case of the filter shown in FIG. 1. From the value of $\lambda_0$, $\alpha_3$ and $\beta_3$ can be determined as follows:

$$\alpha_3 = \left(\frac{\phi_M}{2\pi} - \frac{9}{8}\right)\lambda_0 \approx 0.95 \ (\mu m)$$

$$\beta_3 = \frac{\lambda_0}{4} - \alpha_3 \approx 16.2 \ (\mu m)$$

On the basis of the values of $\alpha_3$ and $\beta_3$, the width $L_{m3}$ of the center finger electrode of the triplet meander electrode fingers located between the sending electrode and the reflecting electrode is 1 μm, while the width $L_{f3}$ of the meander electrode finger located between the reflecting electrode of the same group and the sending electrode of the succeeding group is 16 μm.

FIGS. 12A to 12D are views for illustrating in what manner the undesired waves are suppressed in the filters shown in FIGS. 9 to 11. Phase relations among undesired waves reflected at points a, b, ..., p shown in FIG. 11 are represented by directions of vectors in FIGS. 12A to 12D. More specifically, the undesired wave reflected at the point a shown in FIG. 11 is represented by vector a in FIG. 12A. The undesired wave reflected at the point b in FIG. 11 is represented by a vector b in FIG. 12A. The phases of the undesired waves reflected at points a to p are illustrated, respectively, with reference to the phase represented by the vector a. As will be seen in FIG. 12, the undesired wave (vector a) reflected at the point a is out of phase by 180° with the undesired wave (vector c) reflected at the point c. Accordingly, these waves cancel out each other to be zeroed. Similarly, the undesired wave reflected at the point b (vector b) and the undesired wave reflected at the point c (vector c) cancel out each other to be zeroed. The mutual cancelling of the vectors a, b, c and d is ascribable to the provision of the split electrodes, as in the case of the filter shown in FIG. 4. Further, the undesired wave reflected at a point e in FIG. 11 (represented by vector e in FIG. 12B) and the undesired wave reflected at a point o (represented by vector g in FIG. 12B) cancel out each other. Similarly, vectors f and p cancel out each other with vectors h and n cancelling out each other. Additionally, vectors i and k cancel out each other. Besides, vector j and vector l cancel out each other with vector m and vector o cancelling out each other. In this way, the undesired waves are mutually cancelled out and thus suppressed within one electrode group. Parenthetically, the undesired waves generated at other individual electrode fingers shown in FIG. 11 are suppressed according to the same principle as described above in conjunction with FIG. 12A within the respective group because of the split configuration of the electrodes. As will be appreciated from the foregoing elucidation, according to the structures of the surface acoustic wave filters shown in FIGS. 9, 10, and 11, the undesired waves are suppressed, whereby the surface acoustic wave of improved characteristics can be obtained.

In the case of the electrode array shown in FIGS. 9 and 11, one group of the sending, reflecting and meander electrodes is connected to another group of these electrodes on the group-by-group basis. However, the electrode array may be so implemented as to start with an intermediate electrode in one group and end at an intermediate electrode in another group. By way of example, such electrode array may be adopted in which the array starting with the electrode part indicated by the point a shown in FIG. 11 is followed by cascaded connection of several cascaded electrode groups (or one electrode group), ending at the electrode part corresponding to the point a in the last electrode group. With these arrangements of the electrode array, the undesired waves are mutually cancelled out according to the principle similar to that described in conjunction with FIGS. 11 and 12, whereby the advantageous effect mentioned above can be obtained, as in the case of the filter structures shown in FIGS. 1 to 3.

We claim:

1. A surface acoustic wave filter, comprising:
   a piezoelectric substrate made of a piezoelectric material;
   a pair of input and output electrode arrays, at least one of which includes a sending electrode and a reflecting electrode each of an interdigital form and disposed in the surface acoustic wave traveling direction with a predetermined distance therebetween and a meander electrode disposed between said sensing electrode and said reflecting electrode in a meandering pattern;
   said sending electrode, said reflecting electrode and said meander electrode being supplied with electric signals having an electric phase difference corresponding to the inter-electrode gap between said sending electrode and said reflecting electrode;
   said sending electrode, said reflecting electrode and said meandering electrode constituting a group-type unidirectional electrode array; and
   a phase shifter for generating the electrical phase difference between said electric signals;
   wherein said phase shifter consists of a capacitive element;
   each of said sending electrode and said reflecting electrode having fingers each of a width and an inter-finger gap equal to $\lambda_0/8$ where $\lambda_0$ represents the wavelengths of the surface acoustic wave at a band center frequency;
   distance from the fingers of said sending electrode and said reflecting electrode to the opposite meander electrode being $\lambda_0/8$;
   each of said sending electrode and said reflecting electrode being constituted by a split type electrode;
   said sending electrode and said reflecting electrode being disposed with such a distance therebetween that geometrical phase difference $\phi_M$ give by $5\pi/4 < \phi_M < 7\pi/4$ can be established;
   the meander electrode located between the sending electrode and the reflecting electrode within a same group has one electrode finger having a width $\alpha_1$ while the meander electrode located between the reflecting electrode of one electrode group and the sending electrode of a succeeding electrode group has three electrode fingers in which each of the two outer electrode fingers has a width of $\lambda_0/8$ with the center electrode finger with a width $\beta_1$;

said widths $\alpha_1$ and $\beta_1$ being, respectively, given by $$\alpha_1 = \left(\frac{\phi_M}{2\pi} - \frac{5}{8}\right)\lambda_0, \text{ and}$$

$$\beta_1 = \frac{\lambda_0}{4} - \alpha_1$$

2. A surface acoustic wave filter according to claim 1, wherein said input electrode array is implemented in the form of group-type unidirectional electrode array in which each of said sending electrode and said reflecting electrode is constituted by plural sets of interdigital electrodes.

3. A surface acoustic wave filter according to claim 1, wherein said output electrode array is implemented in the form of group-type unidirectional electrode array in which each of said sending electrode and said reflecting electrode is constituted by plural sets of interdigital electrodes.

4. A surface acoustic wave filter according to claim 1, wherein each of said input and output electrode arrays is implemented in the form of group-type unidirectional electrode array in which each of said sending electrode and said reflecting electrode is constituted by plural sets of interdigital electrodes.

5. A surface acoustic wave filter, comprising:
a piezoelectric substrate made of a piezoelectric material;
a pair of input and output electrode arrays, at least one of which includes a sending electrode and a reflecting electrode each of an interdigital shape disposed in the surface acoustic wave traveling direction with a predetermined distance therebetween and a meander electrode disposed between said sending electrode and said reflecting electrode in a meandering pattern;
said sending electrode, said reflecting electrode and said meander electrode being supplied with electric signals having an electric phase difference corresponding to the inter-electrode gap between said sending electrode and said reflecting electrode;
said sending electrode, said reflecting electrode and said meandering electric constituting a group-type unidirectional electrode array; and
a phase shifter for generating the electrical phase difference between said electric signals;
wherein said phase shifter consists of a capacitive element;
each of said sending electrode and said reflecting electrode having fingers each of a width and an inter-finger gap equal to $\lambda_0/8$ where $\lambda_0$ represents the wavelength of the surface acoustic wave at a band center frequency;
distance from the fingers of said sending electrode and said reflecting electrode to the opposite meander electrode being $\lambda_0/8$;
each of said sending electrode and said reflecting electrode being constituted by a split type electrode;
said sending electrode and said reflecting electrode being disposed with such a distance therebetween that geometrical phase difference $\phi_M$ given by $7\pi/4 < \phi_M < 9\pi/4$ (rad.) can be established;
the meander electrode located between the sending electrode and the reflecting electrode within a same group has two electrode fingers having a width $\lambda_0/8$ and spaced by $\alpha_2$ while the meander electrode located between the reflecting electrode of one electrode group and the sending electrode of a succeeding electrode group has two electrode fingers having a width of $\lambda_0/8$ and spaced by $\beta_2$;
said $\alpha_2$ and $\beta_2$ being, respectively, given by $$\alpha_2 = \left(\frac{\phi_M}{2\pi} - \frac{7}{8}\right)\lambda_0, \text{ and}$$

$$\beta_2 = \frac{\lambda_0}{4} - \alpha_2$$

6. A surface acoustic wave filter according to claim 5, wherein said input electrode array is implemented in the form of group-type unidirectional electrode array in which each of said sending electrode and said reflecting electrode is constituted by plural sets of interdigital electrodes.

7. A surface acoustic wave filter according to claim 5, wherein said output electrode array is implemented in the form of group-type unidirectional electrode array in which each of said sending electrode and said reflecting electrode is constituted by plural sets of interdigital electrodes.

8. A surface acoustic wave filter according to claim 5, wherein each of said input and output electrode arrays is implemented in the form of group-type unidirectional electrode array in which each of said sending electrode and said reflecting electrode is constituted by plural sets of interdigital electrodes.

9. A surface acoustic wave filter, comprising:
a piezoelectric substrate made of a piezoelectric material;
a pair of input and output electrode arrays, at least one of which includes a sending electrode and a reflecting electrode each of an interdigital shape disposed in the surface acoustic wave traveling direction with a predetermined distance therebetween and a meander electrode disposed between said sending electrode and said reflecting electrode in a meandering pattern;
said sending electrode, said reflecting electrode and said meander electrode being supplied with electric signals having an electric phase difference corresponding to the inter-electrode gap between said sending electrode and said reflecting electrode;
said sending electrode, said reflecting electrode and said meandering electrode constituting a group-type unidirectional electrode array; and
a phase shifter for generating the electrical phase difference between said electric signals;
wherein said phase shifter consists of a capacitive element;
each of said sending electrode and said reflecting electrode having fingers each of a width and an inter-finger gap equal to $\lambda_0/8$ where $\lambda_0$ represents the wavelength of the surface acoustic wave at a band center frequency;

distance from the fingers of said sending electrode and said reflecting electrode to the opposite meander electrode being $\lambda_0/8$;

each of said sending electrode and said reflecting electrode being constituted by an electrode of a split type;

said sending electrode and said reflecting electrode being disposed with such a distance therebetween that geometrical phase difference $\phi_M$ given by $9\pi/4 < \phi_M < 11\pi/4$ (rad.) can be established;

the meander electrode located between the sending electrode and the reflecting electrode within a same group has three electrodes in which two outer fingers each have a width of $\lambda_0/8$ with that of the center finger being $\alpha_3$ while the meander electrode located between the reflecting electrode of one electrode group and the sending electrode of a succeeding one electrode group has one electrode finger having a width $\beta_3$, said widths $\alpha_3$ and $\beta_3$ being, respectively, given by $$\alpha_3 = \left(\frac{\phi_M}{2\pi} - \frac{9}{8}\right)\lambda_0, \text{ and}$$

$$\beta_3 = \frac{\lambda_0}{4} - \alpha_3$$

10. A surface acoustic we filter according to claim 9, wherein said input electrode array is implemented in the form of group-type unidirectional electrode array in which each of said sending electrode and said reflecting electrode is constituted by plural sets of interdigital electrodes.

11. A surface acoustic wave filter according to claim 9, wherein said output electrode array is implemented in the form of group-type unidirectional electrode array in which each of said sending electrode and said reflecting electrode is constituted by plural sets of interdigital electrodes.

12. A surface acoustic wave filter according to claim 9, wherein each of said input and output electrode arrays is implemented in the form of group-type unidirectional electrode array in which each of said sending electrode and said reflecting electrode is constituted by plural sets of interdigital electrodes.

* * * * *